United States Patent
Chua et al.

[11] Patent Number: 6,121,130
[45] Date of Patent: Sep. 19, 2000

[54] LASER CURING OF SPIN-ON DIELECTRIC THIN FILMS

[75] Inventors: Chee Tee Chua; Yuan-Ping Lee; Mei Sheng Zhou, all of Singapore, Singapore; Lap Chan, San Francisco, Calif.

[73] Assignees: Chartered Semiconductor Manufacturing Ltd.; National Univ. of Singapore; Nanyang Technology Univ., all of Singapore, Singapore

[21] Appl. No.: 09/192,338

[22] Filed: Nov. 16, 1998

[51] Int. Cl.[7] ................................. H01L 21/469
[52] U.S. Cl. .................. 438/623; 438/795; 438/781; 430/311
[58] Field of Search .................. 438/623, 780, 438/789, 790, 781, 795

[56] References Cited

U.S. PATENT DOCUMENTS

| | | | |
|---|---|---|---|
| 4,983,419 | 1/1991 | Henkel et al. | 427/53.1 |
| 4,983,546 | 1/1991 | Hyun et al. | 438/631 |
| 5,124,238 | 6/1992 | Chakravarty et al. | 430/330 |
| 5,457,073 | 10/1995 | Ovellet | 437/231 |
| 5,548,159 | 8/1996 | Jeng | 257/34 |
| 5,604,380 | 2/1997 | Nishimura et al. | 257/758 |
| 5,669,979 | 9/1997 | Elliot et al. | 134/1 |
| 5,958,268 | 9/1999 | Engelsberg et al. | 219/121.84 |
| 6,013,145 | 1/2000 | Amo et al. | 156/74 |

*Primary Examiner*—Olik Chaudhuri
*Assistant Examiner*—Anh Duy Mai
*Attorney, Agent, or Firm*—George O. Saile; Rosemary L. S. Pike

[57] ABSTRACT

A process for curing low-k spin-on dielectric layers based on alkyl silsesquioxane polymers by laser scanning is described wherein curing is achieved by both photothermal and photochemical mechanisms. The layers are deposited by spin deposition, dried and cured by raster scanning with a pulsed laser at energies between 0.1 and 1 Joules/cm$^2$. Because the laser causes heating of the layer, a nitrogen jet is applied in the wake of the scanning laser beam to rapidly cool the layer and to inhibit oxidation and moisture absorption. The laser induced heating also assists in the discharge of moisture and by-products of the polymerization process. The laser operates at wavelengths between 200 and 400 nm. Insulative layers such as silicon oxide are sufficiently transparent at these so that oxide segments overlying the polymer layer do not inhibit the curing process. Implementation of the laser scanning feature is readily incorporated into an existing spin-on deposition and curing tool.

20 Claims, 2 Drawing Sheets

LASER CURING OF SPIN-ON DIELECTRIC THIN FILMS

BACKGROUND OF THE INVENTION (1) Field of the Invention

The invention relates to processes for the manufacture of semiconductor devices and more particularly to processes related to the deposition of spin-on organic and silicaceous polymeric materials to form dielectric layers on semiconductor wafers.

(2) Background to the Invention and Description of Previous Art

Integrated circuits(ICs) are manufactured by first forming discrete semiconductor devices within the surface of silicon wafers. A multi-level metallurgical interconnection network is then formed over the devices, contacting their active elements and wiring them together to create the desired circuits. The wiring layers are formed by depositing an insulating layer over the discrete devices, patterning and etching contact openings into this layer, and then depositing conductive material into these openings. A conductive layer is then applied over the insulating layer and is patterned to form wiring interconnections between the devices, thereby creating a level of basic circuitry. The basic circuits are then further interconnected by utilizing additional wiring levels laid out over additional insulating layers with via pass throughs.

Spin on coatings have been used in integrated circuit manufacturing for many years. These materials can be applied in liquid form and subsequently hardened or cured to form solid or semi solid layers. The most familiar spin on materials are photoresists and polyimides which have been used since the early 1970s. The photoresists, of course, are generally used for patterning only and as such, are transient films and do not remain in the finished product. Polyimide films have been used from time to time as dielectric and filler layers but frequently suffer processing incompatibilities such as severe outgassing, thermal instability and deformation by shrinkage. More recently, spin-on glasses(SOGs) have received widespread use and success in wafer surface planarization but have also been plagued by outgassing causing blistering and corrosion problems.

Each time a layer of metallization is formed on an integrated circuit wafer and circuit paths are etched within it, the metal pattern introduces a non-planar surface. When the next insulative layer is deposited, by conformal methods such as CVD (chemical vapor deposition), the irregular surface topology is replicated at the insulative layer surface. In order to prevent the cumulative replication of subjacent metal pattern topologies throughout the various metallization levels, it has become common practice in multi-level integrated circuit manufacturing to include means for planarizing the each insulative layer prior to deposition of a metallization layer.

One method for achieving such planarization entails the deposition of an SOG in a liquid form, for example a liquid monomer which, when spun onto the wafer surface, flows into the topological contours. After deposition, the material is dried and cured to form a polymeric insulative film with a smooth, essentially planar, surface for deposition of a subsequent metal layer. The SOGs consist of alcohol soluble silicates and siloxanes which can attain the properties of inorganic glasses when properly cured. The SOGs have found wide acceptance in recent sub-micron semiconductor processing technology because of their low defect density, simplified processing, and low thermal budget. However, the SOG layers have been generally limited to thicknesses of only a few thousand Angstroms. Thicker layers tend to crack and require longer and more careful curing times. A common method of usage is to first deposit a layer of PECVD(plasma enhanced CVD) silicon oxide over a layer of patterned metallization and then lay the SOG over it. The SOG fills in the narrow features. It is then etched back by anisotropic etching to the PECVD oxide surface. The result is the original PECVD layer with the small spacings filled with SOG.

The SOG is deposited by a nozzle directed at the center of a rapidly spinning wafer. Centrifugal force distributes the liquid over the wafer. Excess liquid is flung from the edge of the wafer. The apparatus used to perform this task is of the same type that is conventionally used to deposit photoresist. The wafer is then allowed to dry and then the SOG is cured, typically by a sequence of hot plate steps. The curing process is difficult in that it requires a delicate balance between the rate of solvent and polymerization by-product removal and the rate of formation of the polymer. Failure to provide the proper balance results in cracking and inclusion of impurities which can cause subsequent metal corrosion.

More recently, in order to further improve device performance, researchers have sought to apply insulative materials with lower dielectric constants than the conventional CVD deposited silicate glasses such as silicon oxide, PSG(phosphosilicate glass) and BPSG(borophosphosilicate glass). Various organic insulators such as parylene, fluorinated polyimides and arylene ether polymers, have been successfully used as low dielectric constant(low-k) replacements for silicon oxide. Porous silica based materials such as siloxanes, silsesquioxanes, aerogels, and xerogels have also been implemented as ILD(inter layer dielectric) and IMD(inter-metal dielectric) layers. These materials, like the earlier SOGs used for planarization, are applied by spin on techniques, dried, and cured. Not only do these materials provide a means for planarization but, by virtue of their lower dielectric constant, they also provide a lower capacitance between adjacent conductors thereby improving device performance.

The spin on dielectric (SOD) materials, like the SOGs and polyimides are extremely sensitive to the methods and conditions by which they are dried and cured after application. Not only are the resultant electrical characteristics of the dielectric layer affected by the drying and curing regimen, but also the physical properties including stress, mechanical strength and physical and chemical durability are affected as well. SODs and SOGs, in particular those of a highly porous structure, rapidly absorb moisture when exposed to atmosphere absorb moisture as well as other ambient gases. Quellet, U.S. Pat. No. 5,457,073 reports a method for in-situ discharge of absorbed moisture from porous inorganic or quasi-inorganic SOGs exposed in via openings by vacuum or inert gas annealing at temperatures below 500° C. followed by sealing off the exposed surfaces by depositing the interconnect material into the openings.

Jeng, U.S. Pat. No. 5,548,159 deposits porous dielectric materials over metal patterns and then etches back to leave the porous material only within the narrow line spacings and adjacent to but not over the metal line segments. A dense dielectric material is then deposited over the wafer which seals off the porous dielectric material. Vias are then formed to the metal line segments wholly within the dense dielectric material so that the porous dielectric is not exposed within the via openings. The porous SODs are dried and cured by baking.

Thermal processes for curing SODs have included long bakes in vertical furnaces for periods as long as 5 to 6 hours.

More recent approaches have included e-beam curing. However, because of the slow throughput of the furnace curing and the vacuum requirement of the e-beam processing, these methods are not attractive for integrated circuit manufacturing.

Henkel, et.al., U.S. Pat. No. 4,983,419 cites a method of polymerization and cross linking of linear and branched single chain, non functionalized organosiloxanes by photo curing with pulsed laser radiation to form thin dielectric layers. The organosiloxanes may contain alkyl and aryl groups and may be cyclic but must have no functional groups or photo initiators or photo sensitizers. The photo hardening takes place in an oxygen free atmosphere. The layers are reported to have good dielectric properties but none are cited.

Chakravorty, et. al., U.S. Pat. No. 5,124,238 cites a method for curing photo sensitive polyimide films with reduced shrinkage after photo patterning the film with ultraviolet (uv) radiation. A first low temperature bake, prior to the radiation exposure brings about the greatest film shrinkage, due to solvent release. The uv radiation, which causes the cross linking of the polymer, then imparts little additional shrinkage.

SUMMARY OF THE INVENTION

It is an object of this invention to provide an improved method for curing spin-on dielectric materials.

It is another object of the current invention to provide an improved method for curing double chained organosiloxane spin-on dielectric materials such as polysilsesquioxanes, which draw upon both photochemical and photothermal polymerization and cross linking.

It its another object of this invention to provide an improved method for curing polyimide coatings on substrates.

It its another object of this invention to provide a method for curing spin-on deposited dielectric materials which can be incorporated into an existing spin-on deposition tool thereby permitting the deposition, baking and curing to be accomplished on a single tool.

It is yet another object of this invention to provide a method for reducing wafer movement and handling in a spin-on material deposition process step thereby reducing particulate contamination and improving product yield.

It is yet another object of this invention to provide a method for improving the efficiency of residual solvent and by-product elimination during the polymerization and/or cross linking of deposited SOD and SOG films.

These objects are accomplished by forming SOD and SOG layers of alkyl or aryl silsesquioxanes and curing these layers with a pulsed laser beam having a frequency of between about 200 and 400 nm. and at laser energies of between about 0.1 and 1.0 Joules $cm^{-2}$. The polysilsesquioxanes comprise a class of organosiloxanes which are double chained and which polymerize and cross link to form a three dimensional network at lower laser energies than the single chained organosiloxanes. The double chain silsesquioxanes also absorb greater amounts of laser energy in the wavelength region between 200 and 400 nm. than the single chain organosiloxanes. Consequently, the laser curing of poly silsesquioxanes is accompanied by the production of heat which further assists in the polymerization and cross linking as well as the discharge of residual solvent and by-products. The curing process is both photochemical and photothermal.

The as deposited SOD layer is first subjected to a low temperature bake whereby solvent is discharged from the film. A pulsed laser beam is then raster scanned over the wafer causing both photo thermal and photo chemical polymerization and cross linking of the deposited layer. Further discharge of residual solvent and polymerization by-products is enhanced by the thermal component of the polymerization process.

An apparatus for spin coating and curing polymer films is provided. After spin coating the wafer with the polysilsesquioxane monomer, the wafer baked on hot plates and then transferred to a fixed platform fitted with means for raster scanning a laser beam over the wafer surface. Alternately, the wafer may be translated under a stationary laser beam by mounting the wafer on a programmable platform. Cooling of the wafer surface after the laser treatment is accomplished by directing a jet of coolant gas, for example nitrogen, at the wafer surface in the wake of the laser beam. The nitrogen jet not only cools the just irradiated region, but also provides an oxygen free ambient over the coating during the laser curing process and carries away vapors issued from the curing polymer film. The entire coating, baking, and curing operations are accomplished in a single processing tool. Transfer of the wafer to the stations within the tool is accomplished by conventional robotic arm technology.

DESCRIPTION OF THE PREFERRED EMBODIMENTS

Figure 1A:
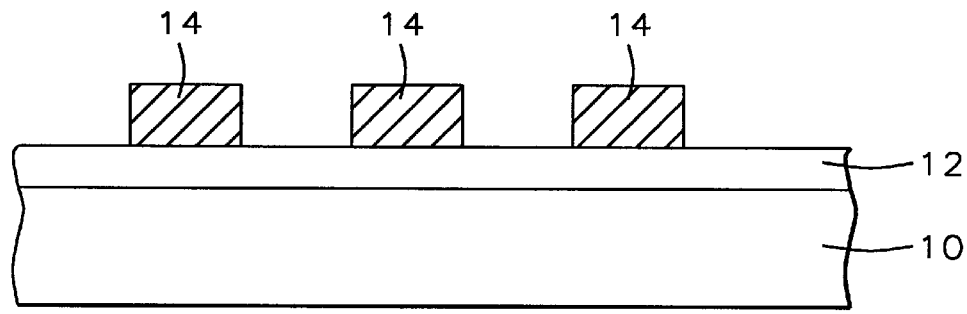
FIGS. 1A through FIG. 1E are cross sections of a region of an in-process silicon wafer showing the process steps used in the accomplishment of the objects of this invention.

In a first embodiment of the cur rent invention, a SOD layer is formed of a low-k dielectric porous silicon oxide using methyl silsesquioxane as a precursor. Referring to FIG. 1A, a metal pattern 14 is formed on an insulative layer 12 on the wafer 10. The insulative layer 12 of the embodiment is taken to be a first insulative layer on the silicon wafer 10. Contacts(not shown) are formed in the insulative layer at locations elsewhere on wafer 10, which connect elements of semiconductor devices within the surface of wafer 10 to the metal pattern 14. The metal pattern 14 of the embodiment is assumed to be a first metal interconnection level of an integrated circuit.

The methods for forming semiconductor devices such as MOSFETS (metal oxide silicon field effect transistors) and bipolar transistors in silicon wafers are well known to those in the art. Contacts are formed to elements of these devices by etching openings in the insulative layer 12 and forming conductive plugs, for example tungsten plugs, which connect to subjacent semiconductor elements. The formation of contacts is also a well established and well understood technology in the semiconductor industry. The wiring pattern is formed by depositing a blanket metal layer of aluminum or an aluminum alloy on the insulative layer 12 by evaporation or sputtering. Alternately the metal layer 14 may be formed of other conductive materials such as tungsten and may be deposited by CVD. The metal layer 14 is deposited to a thickness of between about 5,000 and 8,000 Angstroms and is patterned by conventional photolithographic procedures which include forming a photomask pattern on the blanket layer and then etching the pattern in the metal layer by plasma etching or RIE(reactive ion etching).

While in the current embodiment, the metal layer 14 is a first metallization layer of an integrated circuit, the process as detailed by this invention can also be applied at other metallization levels, although at the present state of the art, it is the first metallization level which is of greater interest because, the low-k materials afford the greatest benefit to device performance because of closely spaced wiring components.

Figure 1B:
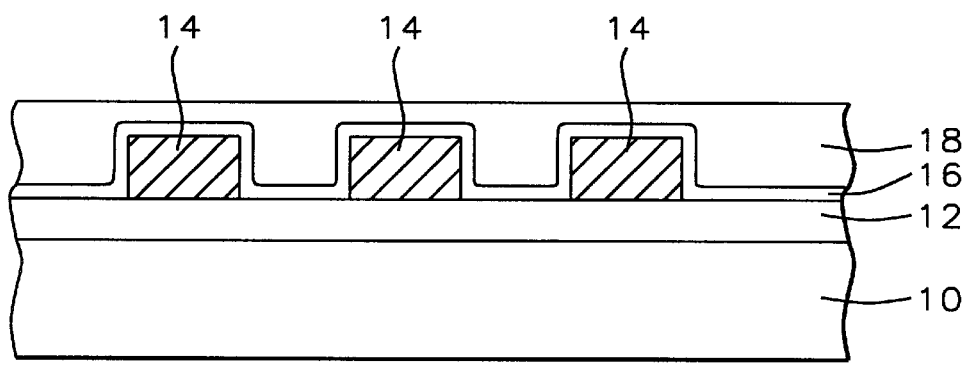

Referring now to FIG. 1B, a conformal silicon oxide layer 16 is formed over the wafer 10. The layer 16 is deposited by PECVD at a temperature of between about 395 and 405° C. to a thickness of between about 3,000 and 6,500 Angstroms using a silane precursor. The silicon oxide layer provides a protective barrier between the metal lines 14 and the subsequently deposited low-k organic layer. The silicon oxide layer 16 prevents vapors emitted from the organic layer from causing corrosion of the metal wiring 14. In addition, as will later become apparent, the layer 16 also permits the low-k layer to be confined within the spaces between but not over the metal features 14 after a subsequent planarization procedure. Alternately, the conformal layer 16 may be formed of other insulative materials, for example silicon nitride or silicon oxynitride.

A layer 18 of an alkyl silsesquioxane monomer, for example methyl silsesquioxane, is applied over silicon oxide layer 10 with a wafer spin coater. The liquid Methyl silsesquioxane precursor is commercially available as SOP 418 from Allied Signal Advanced Microelectronic Materials, 1349, Moffett Park Drive, Sunnyvale, Cailf., 94089 and is carried in an alcoholic solvent. Methyl silsesquioxane is representative of a class of double chain organo silicon polymer materials which exhibit non-random cross linking forming a three dimensional network when fully cured.

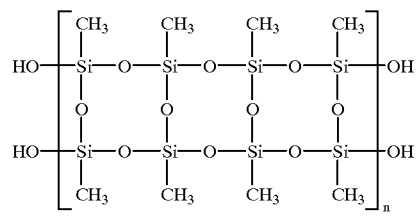

Methyl Silsesquioxane (SOP 418)

A suitable, commercially available, spin coater for the application of the SOD layer 18 is the Model MK-8 manufactured by Tokyo Electron Limited, URL. http://www.tel.co.jp/. Procedures for application of the liquid material are well known to those in the art. Proper spin speed and liquid application rate are easily determined. After application, the liquid is permitted to dry briefly. The wafer 10 is then sequentially baked on hot plates for about one minute intervals at temperatures beginning at about 180° C. to 250° C. to drive off residual solvent. Sequentially baking on hot plates at increasing temperatures is a common practice for driving off residual solvent from spun-on films. The baked methyl silsesquioxane SOD layer 18 is between about 4,000 and 5,600 microns thick and extends above the silicon oxide 16 layer and over the metal features 14. Alternately, the deposited layer 18 may be baked by laser radiation at about 1 kHz and 1 Joule/cm2 for between about 5 and 15 minutes.

The SOD layer 18 is next further cured to assure proper polymerization, cross linking, and stabilization of the resultant porous silicon oxide matrix. A pulsed uv laser, for example a NdNYAG laser, with a beam spot size of approximately 100 mm$^2$ is used for final curing of the SOD layer. The laser wavelength is selected between about 200 and 400 nm. with a pulse frequency of between about 10 Hz and 10 kHz. The laser energy is between about 0.1 and 1.0 Joule/cm$^2$. Alternately, a continuous uv laser or a pulsed deep uv laser, for example, a KrF excimer laser may be used.

Figure 1C:
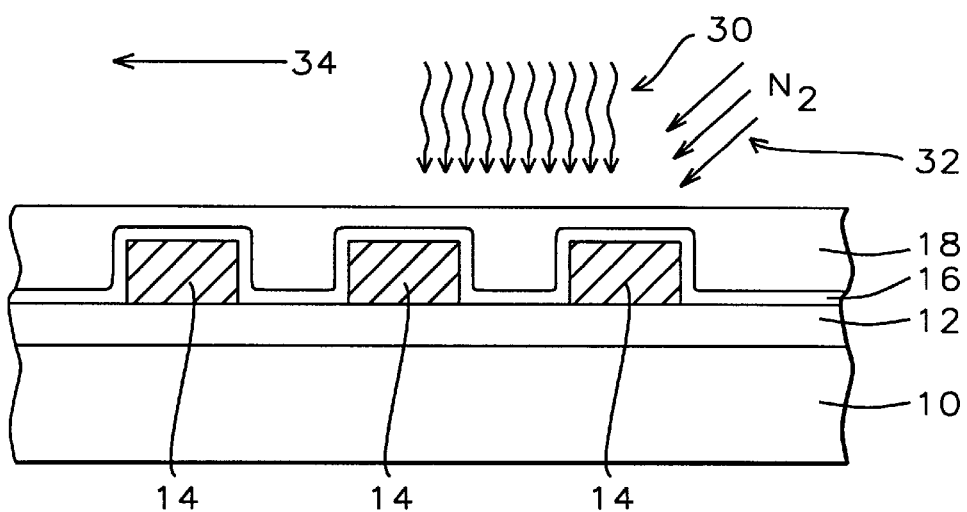

The laser is fitted with optical means to automatically scan the laser beam across the wafer in a raster pattern. Referring to FIG. 1C, the laser beam 30 is raster scanned over the wafer 10 surface at a rate which must be determined experimentally according to the thickness of the deposited layer. Absorption of laser energy hv, by the silsesquioxane film causes the irradiated area of the wafer to become heated effecting photothermal curing of the SOD layer 18. The curing mechanism of the SOD layer by uv laser irradiation is postulated to be photothermal as well as photochemical. A flow of nitrogen is provided in the wake of the moving laser beam to cool the irradiated area after the beam has passed. The nitrogen flow 32 is shown in the wake of the laser beam 30 as the beam travels across the wafer 10 in the direction 34. The nitrogen 32 is produced by a jet nozzle which is mechanically synchronized to the travel of the laser beam so that the flow 32 continuously bathes the wafer in the wake of laser beam. Methods for achieving this synchronization are easily implemented by those familiar with the art, Additional nitrogen jets (not shown) may optionally be provided over other regions of the wafer in order to maintaining a non-oxidizing ambient during cure.

Alternately the wafer 10 may be mounted on a programmable x-y stage and the laser beam placed in a fixed position over the wafer. The raster scanning is then achieved by causing the table to travel in a raster pattern in the path of the fixed laser beam. The trailing nitrogen jet 32 is thereby also in a fixed position in the wake of the laser beam, eliminating the need to provide mechanical synchronization between the laser and the training nitrogen flow 32.

Figure 1D:
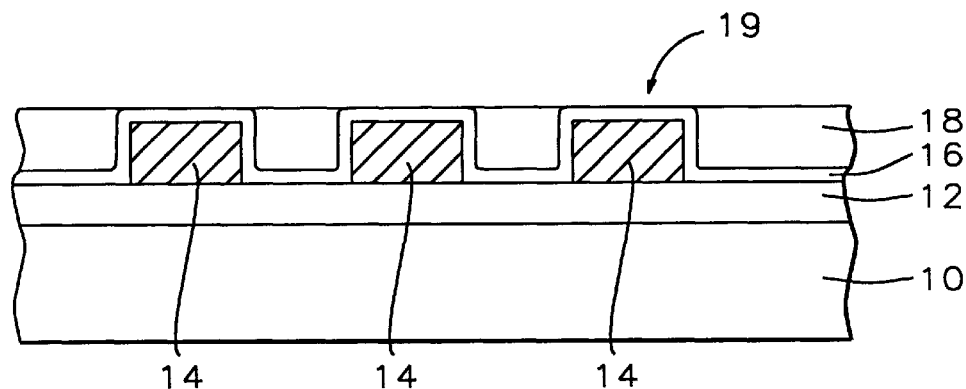

Referring next to FIG. 1D, the polymer SOD layer 18 is planarized preferably by RIE or anisotropic plasma etchback, to expose areas 19 of the layer 16 over the metal wiring lines 14. This planarization not only removes global surface irregularities of the SOD layer 18 but also removes the polymer material from regions 19 where via connections are subsequently formed to the metal lines 14. Methods of RIE and plasma etchback to reduce the thicknesses of films are well known in the art. Etchant gases, containing fluorocarbons, commonly used to etch silicon oxide layers, are also suitable for accomplishing etchback of the cured polysilsesquioxane layer 18. Alternately, a CMP process may be used to reduce the thickness of the SOD layer 18.

Figure 1E:
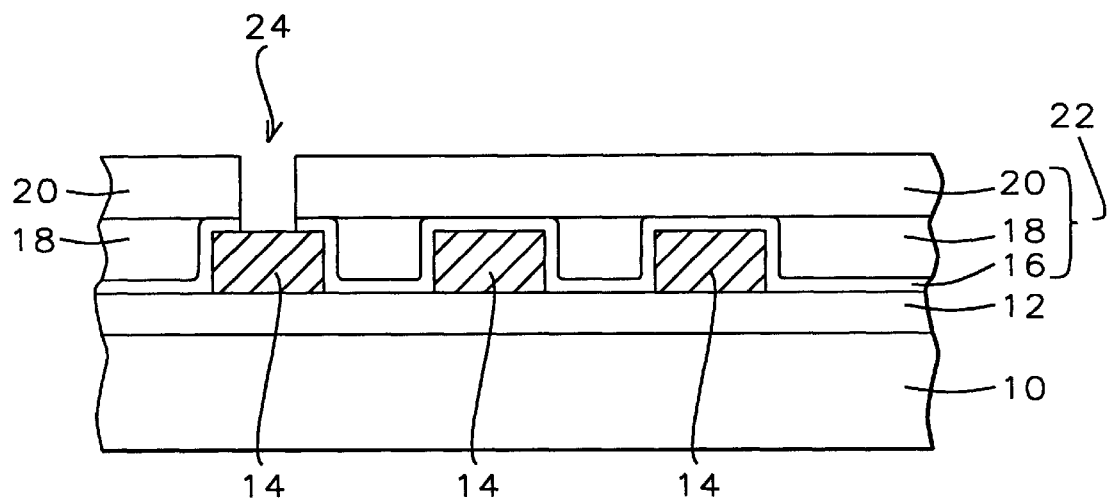

Referring to FIG. 1E, an insulative layer 20 is deposited on the wafer 10 to form a composite IMD layer 22 which comprises the conformal silicon oxide layer 16, the SOD layer 18 in regions between the metal lines 14, and the insulative layer 20. The insulative layer 20 is preferably silicon oxide derived from TEOS (tetraethyl orthosilicate) and deposited by PECVD. The layer 20 is then planarized by CMP in preparation for the deposition of the next metallization layer. The final polished thickness of the insulative layer 20 is between about 6,000 and 9,500 Angstroms. The layer 20 may alternately be of another insulative material, for example PECVD silicon nitride, or any suitable insulative material conventionally used to form an IMD layer.

A via opening 24 is next formed in the in the IMD layer 22 exposing the metal line 14. The SOD layer, having been removed from over the metal regions is not exposed by the via opening and is therefore not exposed to ambient contaminants during the via formation process. By planarizing the SOD layer down to the conformal silicon oxide layer 16, the SOD regions are permanently seal against any further absorption of foreign material, for example water. In addition, conductive via material (not shown), subsequently deposited into the via opening 24 does not contact the SOD layer.

Figure 2:
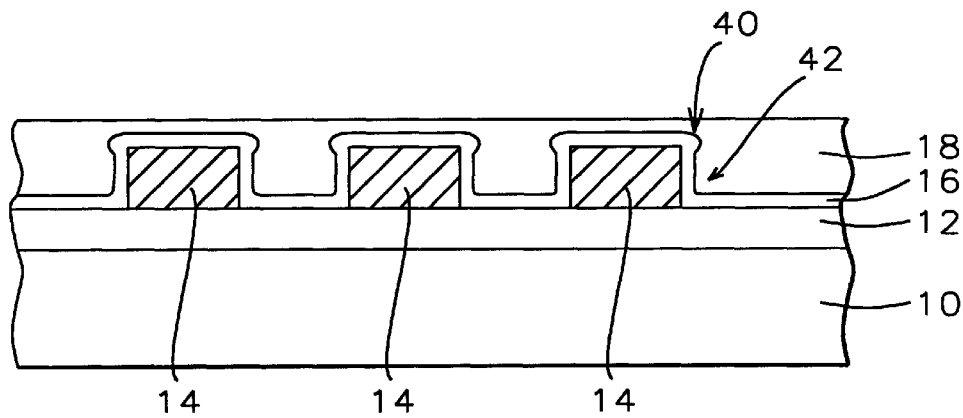
FIG. 2 is a cross section of a region of an in process silicon wafer wherein the process of the invention addresses a variation of configuration of the structure to which the invention is applied.

In FIG. 2 there is shown a variation of the configuration of the silicon oxide layer 16 wherein a lip or overhang 40 of the layer 16 is present. The silicon oxide overhang 40 is transparent to the wavelengths of the laser beam and therefore that portion 42 of SOD material under the overhang 40 is properly exposed and cured as if the overhang were not present. The overhang 40 is shown to illustrate the method of the invention is capable of properly curing the SOD layer 18 even in the presence of irregular vertical walls.

The embodiment uses a silicon wafer substrate. It should be understood by those skilled in the art that other substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

Although the embodiments of the invention are applied to form SOD layers based on methylsilsesquioxane to form SOD layers other alkyl and aryl silsequioxanes or double chain polymers which exhibit non-random cross linking, as well as other carbon based polymer materials such as polyimides are contemplated by this invention.

What is claimed is:

1. A method for forming a polymer dielectric layer on a substrate comprising:
    (a) providing a substrate;
    (b) depositing a polymer layer by spin coating;
    (c) baking said polymer layer; and
    (d) curing said polymer layer by raster scanning a laser beam over said polymer layer while cooling said polymer layer after passage of said laser beam by projecting a flow of a cooling gas on the surface of said polymer layer in the wake of said laser beam.

2. The method of claim 1 wherein said polymer layer is selected from the group consisting of an alkyl silsesquioxane, an aryl silsesquioxane, and a polyimide.

3. The method of claim 1 wherein said substrate is a silicon wafer.

4. The method of claim 1 wherein said polymer layer is between about 4,000 and 5,600 Angstroms thick.

5. The method of claim 1 wherein said laser beam is provided by a pulsed Nd/YAG laser having a pulse frequency of between about 10 Hz and 10 kHz, a wavelength of between about 200 and 400 nm., and an energy of between about 0.1 and 1 Joule/cm$^2$.

6. The method of claim 1 wherein said laser beam is provided by a pulsed excimer laser.

7. The method of claim 1 wherein said laser beam has a spot size of 100 mm$^2$. or thereabout.

8. The method of claim 1 wherein said cooling gas is nitrogen.

9. A method for forming an inter metal dielectric layer of an integrated circuit having a polymer dielectric between conductive elements comprising:
    (a) providing a substrate having integrated circuit components and a pattern of conductive elements on a first insulative layer;
    (b) depositing a conformal second insulative layer on said pattern;
    (c) depositing a polymer layer on said second insulative layer by spin coating;
    (d) baking said polymer layer;
    (e) curing said polymer layer by raster scanning a laser beam over said polymer layer while cooling said polymer layer after passage of said laser beam by projecting a flow of a cooling gas on the surface of said polymer layer in the wake of said laser beam;
    (f) etching back said polymer layer until portions of said second insulative layer are exposed over said conductive elements;
    (g) forming a third insulative layer on said polymer layer; and
    (h) planarizing said third insulative layer.

10. The method of claim 9 wherein said conductive elements are aluminum.

11. The method of claim 9 wherein said second insulative layer is selected from the group consisting of silicon oxide, silicon nitride, and silicon oxynitride.

12. The method of claim 9 wherein said second insulative layer is between about 3,000 and 6,500 Angstroms thick.

13. The method of claim 1 wherein said polymer layer is selected from the group consisting of an alkyl silsesquioxane, an aryl silsesquioxane, and a polyimide.

14. The method of claim 9 wherein said polymer layer is between about 4,000 and 5,600 Angstroms thick.

15. The method of claim 9 wherein said laser beam is provided by a pulsed Nd/YAG laser having a pulse frequency of between about 10 Hz and 10 kHz, a wavelength of between about 200 and 400 nm., and an energy of between about 0.1 and 1 Joule/cm$^2$.

16. The method of claim 9 wherein said laser beam is provided by a pulsed excimer laser.

17. The method of claim 9 wherein said laser beam has a spot size of 100 mm$^2$. or thereabout.

18. The method of claim 9 wherein said cooling gas is nitrogen.

19. The method of claim 9 wherein said planarizing is chemical mechanical planarization.

20. The method of claim 9 wherein said third insulative layer is between about 6,000 and 9,500 Angstroms thick after said planarizing.

* * * * *